United States Patent
Cobley et al.

(10) Patent No.: US 6,911,068 B2
(45) Date of Patent: Jun. 28, 2005

(54) PLATING BATH AND METHOD FOR DEPOSITING A METAL LAYER ON A SUBSTRATE

(75) Inventors: Andrew J. Cobley, Conventry (GB); Mark J. Kapeckas, Marlborough, MA (US); Erik Reddington, Ashland, MA (US); Wade Sonnenberg, Edgartown, MA (US); Leon R. Barstad, Raynham, MA (US); Thomas Buckley, Dedham, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/970,171

(22) Filed: Oct. 2, 2001

(65) Prior Publication Data

US 2004/0206631 A1 Oct. 21, 2004

(51) Int. Cl.⁷ .................. C23C 16/00; C23C 18/00; C25D 3/00; C25D 3/10; C25D 3/50
(52) U.S. Cl. ................ 106/1.25; 106/1.26; 106/1.27; 106/1.28; 106/1.29; 205/261; 205/264; 205/265; 205/267; 205/281; 205/290; 205/296
(58) Field of Search .............. 106/1.25, 1.26, 106/1.27, 1.28, 1.29; 205/261, 264, 265, 267, 269, 281, 290, 296

(56) References Cited

U.S. PATENT DOCUMENTS 4,129,482 A * 12/1978 Lash ................... 205/260
4,416,742 A * 11/1983 Kinase et al. ........... 205/264
4,441,969 A *  4/1984 Tremmel .............. 205/275

FOREIGN PATENT DOCUMENTS

JP    2000248397 A  *  9/2000  ........... C25D/3/38

OTHER PUBLICATIONS

Kruglikov et al. "Use of a Rotating Disk Electrode for Evaluating the Leveling Action of Some Additives in a Cooper–Plating Sulfate Electrolyte", Trudy Instituta—Moskovskii Khimiko–Tekhnologicheskii Institut Imeni D. I. Mendeleeva (no month, 1970), No. 67, pp. 236–239.*

* cited by examiner

Primary Examiner—Edna Wong
(74) Attorney, Agent, or Firm—John J. Piskorski (57) ABSTRACT

A metal plating bath containing organic compounds that inhibit or retard the consumption of plating bath additives. The additives are chemical compounds that improve the brightness of the plated metal, the physical properties of the plated metal especially with respect to ductility and the micro-throwing power as well as the macro-throwing power of the plating bath. The organic compounds that inhibit or retard the consumption of additives increases the life of the plating bath and improves the efficiency of the plating process. The plating baths containing the organic compounds that inhibit or retard additive consumption can be employed to copper, gold, silver, palladium, platinum, cobalt, cadmium, chromium, bismuth, indium, rhodium, ruthenium, and iridium.

23 Claims, 2 Drawing Sheets

PLATING BATH AND METHOD FOR DEPOSITING A METAL LAYER ON A SUBSTRATE

BACKGROUND OF THE INVENTION

The present invention is directed to a plating bath and method for improving deposition of a metal on a substrate. More specifically, the present invention is directed to a plating bath and method for improving deposition of a metal on a substrate by including organic compounds in the plating bath that inhibit the degradation of plating bath additives.

Deposition of a metal on a substrate is used in a variety of industrial applications such as electroforming, electrorefining, manufacture of copper powder, electroplating, electroless plating and the like. The process of plating a substrate with a metal is used in the production of decorative articles for sanitary appliances, automobile parts, jewelry and furniture fittings, many electrical devices and circuits such as printed wiring and circuit boards, electrolytic foil, silicon wafer plating, and the like. Examples of metals that may be plated on a substrate include copper, gold, silver, palladium, platinum, zinc, tin, nickel, lead, cobalt and alloys thereof. Although many metals are employed in plating in the production of decorative articles and electrical devices, copper is one of the most common metals plated. The electronics industry extensively employs copper as a metal in the manufacture of printed wiring and circuit boards as well as other electronic articles.

The electronics industry has a number of requirements for copper deposits on printed wiring boards. For example, copper layers can not form any cracks when subject to thermal shock (immersed at least once for 10 sec. in liquid tin/lead solder at 288° C.). In addition, the copper layers must be smooth, and as uniformly thick at all locations of a coated surface. Also, deposition procedures must be easy to manage and economical.

Anodes, such as copper anodes, that may decompose during electroplating are often used in the electroplating of copper. Such anodes are known in the industry as soluble anodes. Soluble anodes may be in the form of plates, bars or spheres. The plates and bars are connected to a power supply with a suitable fastening means. The spheres come in baskets that often consist of titanium. The spheres are connected to a power supply with suitable fastening means. Such anodes decompose at about the same rate during deposition as the copper is deposited from the deposition bath, the amount of copper in the deposition solution remains about constant. Thus, copper replenishment is not necessary.

Another type of anode is the insoluble anode. Exterior dimensions of insoluble anodes do not change during metal deposition process. Such anodes consist of inert materials such as titanium or lead that can be coated with catalytic metals such as platinum to prevent high anodic overvoltages. Insoluble anodes are preferred over the soluble anodes in the production of printed wiring and circuit boards. Electroplating processes employing insoluble anodes are more versatile than those using consumable electrodes, permit higher plating speeds, require smaller apparatus size, ease of maintenance, improved solution flow and agitation and allow anodes to be placed close to the cathodes. Particularly advantageous is the fact that the insoluble anode does not change size (i.e., cell geometry remains fixed). Thus, more uniform plating results are obtained. In addition, copper salts used to provide a source of copper are often available as products of etching procedures associated with the production of copper plated devices. For example, in the production of circuit boards, a copper layer is put down over an entire surface of an insulating substrate and part of the copper etched off to produce the circuit board of interest.

Plating metal on a substrate, such as electroplating with copper, is used extensively in a variety of manufacturing procedures. Copper plating is used to prevent corrosion on various surfaces (i.e., iron surfaces), as a binding layer for additional metal layers, to increase electrical or thermal conductivity and to provide conducting paths in many electrical applications. Electroplating with copper is employed in the manufacture of electrical devices such as circuit boards, integrated circuits, electrical contact surfaces and the like.

Plating metal is a complex process that involves multiple ingredients in a plating bath. In addition to metal salts that provide a source of metal, pH adjusters and surfactants or wetting agents, many plating baths, such as electroplating baths, contain chemical compounds that improve various aspects of the plating process. Such chemical compounds or additives are auxiliary bath components that are used to improve the brightness of the metal plating, the physical properties of the plated metal especially with respect to ductility and the micro-throwing power as well as the macro-throwing power of the electroplating bath. Of main concern are additives that have an effect on the bright finish, leveling and uniformity of metal deposition on surfaces. Maintaining bath concentrations of such additives within close tolerances is important to obtain high quality metal deposits. Such additives do breakdown during metal plating. The additives breakdown due to oxidation at the anode, reduction at the cathode and by chemical degradation. When additives breakdown during plating, the breakdown products may result in metal layer deposit characteristics that are less than satisfactory for industry standards. Regular additions of additives based upon empirical rules established by workers in the industry to try and maintain optimum concentrations of the additives have been employed. However, monitoring the concentrations of the additives that improve metal plating is still very difficult because the additives are present in small concentrations, i.e., parts per million of solution, in the plating baths. Also the complex mixtures of the additives and the degraded products formed from the additives during plating complicate the replenishment process. Further, depletion of specific additives is not always constant with time or bath use. Accordingly, the concentration of the specific additives is not accurately known and the level of the additives in the bath eventually diminishes or increases to a level where the additives are out of the acceptable range of tolerance. If the additive content goes too far out of the range of tolerance, the quality of the metal deposit suffers and the deposit may be dull in appearance and/or brittle or powdery in structure. Other consequences include low throwing power and/or plating folds with bad leveling. Electroplating of through-hole interconnections in the manufacture of multi-layer printed circuit boards is an example of where high quality plating is required.

Stability and lifetime of a plating bath is very important. Increased stability of the additives that improve metal plating leads to longer lifetimes for plating baths. Plating baths having longer lifetimes are economically very important. Frequent replacement of plating baths, as mentioned above, as well as disposal of baths containing degraded additives interrupts metal plating operations. Such interruptions reduce product yield. Accordingly, stable plating baths where breakdown of the additives is prevented or reduced, are highly desirable.

U.S. Pat. No. 4,469,564 discloses a copper electroplating process that allegedly increases the electroplating bath lifetime. The patent states that the process may be employed with a soluble or insoluble anode. A cation-permeable membrane surrounds the anode to prevent organic additives from contacting the anode and being oxidized by the anode. A disadvantage to such a process is that the cation-permeable membranes are exposed to corrosive chemicals for long periods of time that may cause the membranes to decompose. For example, bath pH ranges may be less than 1.0 to as high as 11.0 and higher. Also, bath pH ranges may fluctuate over time as bath components are consumed or breakdown. Thus, workers in the art must be selective in choosing a membrane with a chemical composition that does not breakdown due to pH fluctuations during electroplating. Additionally, as discussed above, electroplating baths contain a variety of components. Components such as the organic additives or their breakdown products may block pores in the cation-permeable membrane preventing passage of cations through the bath. Thus, workers must shut down the electroplating process and replace the membrane. Both blockage of the pores and shutting down the process lead to inefficiency in metal electroplating.

Japanese Patent Application 63014886 A2 discloses an acid copper electroplating bath with chloride ions and also containing transition metal ions in amounts of from 0.01–100 g/l. The electroplating bath allegedly does not suffer from organic additive consumption. Such organic additives include brighteners, leveling agents, hardener, malleability and ductility modifiers, and deposition modifiers.

EP 0402 896 discloses a method of stabilizing an organic additive, such as a brightener, in an acid copper electroplating solution. The process employs a soluble anode of copper chips in a titanium basket. Transition metal salts of manganese, iron, chromium, and titanium are added to the electroplating solution in concentrations of not more than 5 g/l. The transition metals may exist in at least two positive oxidation states, but are substantially present in solution in their lowest common positive oxidation state. The presence in solution of the positive oxidation states of the transition metal ions allegedly stabilizes the organic additives.

U.S. Pat. No. 6,099,711 discloses an electroplating process employing an insoluble anode where metal ions, such as copper ions, are replenished in the electroplating bath by employing a metal ion generator in the form of a reversible redox system. Because an insoluble anode is employed instead of a soluble anode, metal ions are not replenished in the bath by dissolution of the anode. Thus, the reversible redox system replenishes the metal ions. Iron (II) and iron (III) compounds are used as an electrochemically reversible redox system. Other redox systems disclosed in the patent include metals of titanium, cerium, vanadium, manganese and chrome. Such metals may be added to a copper depositing solution in the form of iron (II) sulfate-heptahydrate, iron (II) sulfate-nonahydrate, titanyl-sulfuric acid, cerium (IV) sulfate, sodium metavanadate, manganese (II) sulfate or sodium chromate. The patent states that the redox systems may be combined.

In addition to replenishing metal ions in the electroplating bath, the patent states that the process prevents degradation of organic additives to a significant extant. Degradation of large amounts of organic additives in a bath occurs electrolytically at the anode due to the anode potentials. Workers in the art believe that the potential of the iron (II) to iron (III) redox reaction (about 0.530 V vs SCE) provides an anode potential low enough to prevent brightener oxidation at the anode. Thus, brightener consumption is reduced. Such organic additives include brighteners, levelers, and wetting agents. Brighteners that are employed include water-soluble sulfur compounds and oxygen-containing high-molecular weight compounds. Other additive compounds include nitrogenous sulfur compounds, polymeric nitrogen compounds and/or polymeric phenazonium compounds.

Although the patent alleges to replenish metal ions and to reduce brightener consumption, the process, disclosed in the '711 patent, has disadvantages. Iron (III) may be reduced back to iron (II) in the reversible redox reaction instead of oxidizing copper to copper (II). Additionally, there is the problem that iron may build-up in the system over time requiring shut down and cleaning operations. Such operations reduce the efficiency of the process, and raise the cost of the process. Another disadvantage to the process is that the concentrations of the compounds in the redox system must be arranged in such a way that a constant concentration of metal ions is maintained in the deposition solution. Thus, there is a narrow or nonexistent margin of error in the concentrations of redox compounds in the deposition solution for the process to operate. Accordingly, minor changes in the concentrations of the redox compounds may hinder the operation of the process.

Japanese Patent Application 96199385 discloses an electroplating method and solution containing fluoride-based surfactants and organic additives such as brighteners. Addition of the fluoride-based surfactants allegedly prevents brightener consumption.

Although there are methods for preventing the degradation of additives in metal plating baths, there is still a need for additional methods of preventing the degradation of bath additives.

SUMMARY OF THE INVENTION

The present invention is directed to a metal plating bath containing organic compounds that inhibit the degradation of additives in the plating bath, and a method of plating a metal on a substrate employing the metal plating baths. Such organic compounds have the following formula:

where R, $R^1$, $R^2$, and $R^3$ are each independently selected from hydrogen; halogen; ($C_1$–$C_{20}$) linear, branched, or cyclic alkyl; ($C_2$–$C_{20}$) linear, branched, or cyclic alkenyl; ($C_2$–$C_{20}$) linear or branched alkynyl; —CN; —SCN; —C=NS; —SH; —$NO_2$; —$SO_2H$; —$SO_3M$; —$PO_3M$; —$P(R^4)_2$, where $R^4$ is hydrogen or halogen; —$Si(OH)_3$; ($C_1$–$C_{20}$) alkyl-O($C_2$–$C_3$O)$_x R^6$, ($C_1$–$C_{12}$) alkyphenyl-O ($C_2$–$C_3$O)$_x R^6$, phenyl-O($C_2$–$C_3$O)$_x R^6$, where x is an integer of from 1–500 and $R^6$ is hydrogen, ($C_1$–$C_4$) alkyl or phenyl; silane; silyl; sulfonyl halide; aminyl; hydroxyaminyl; aminyl halide; acyl halide; —$COR^5$, where $R^5$ is —OH, or ($C_1$–$C_{20}$) linear, branched or cyclic alkyl, ($C_2$–$C_{20}$) linear, branched, or cyclic alkenyl, ($C_2$–$C_{20}$) linear or branched alkynyl, or ($C_1$–$C_{20}$) linear, or branched alkoxy; or —OH with the proviso that a carboxy is present as a substituent on the compound; the ($C_1$–$C_{20}$) alkyl, ($C_2$–$C_{20}$) alkenyl, the ($C_2$–$C_{20}$) alkynyl, and the ($C_1$–$C_{20}$) alkoxy groups may be unsubstituted or substituted; M is hydrogen or an alkali metal; or $R^1$ and $R^2$ may be taken together to form a chemical bond; or $R^1$ and $R^2$ may be taken together along with the atoms to which they are attached to form a 5 to 7 membered ring, or to form a 5 to 7 membered heterocyclic ring where oxygen or nitrogen are hetero-atoms in the ring, the 5 to 7 membered ring, or the 5 to 7 membered heterocyclic ring may contain one or more carbonyl groups; the 5 to 7 membered ring or the 5 to 7 membered heterocyclic ring may be fused with one or more five to six membered rings, the one or more five to six membered fused rings may contain one or more hetero-atoms where the hetero-atom is oxygen or nitrogen, the 5 to 6 membered fused rings and the 5 to 6 membered fused rings with a heteroatom may contain a carbonyl group; and the 5 to 7 membered rings, the 5 to 6 membered fused rings, and the heterocyclic rings may be unsubstituted or substituted.

The additive consumption inhibiting organic compounds of the present invention may be employed in metal plating baths for plating copper, gold, silver, palladium, platinum, cobalt, cadmium, chromium, bismuth, indium, iridium, ruthenium, and rhodium.

Advantageously, addition of the organic compounds of the present invention that inhibit additive consumption to a plating bath provide for a plating bath that has a long life, and a method of metal plating that is very efficient. Also, because the organic compounds of the present invention inhibit degradation of the additives, plating baths of the present invention provide for uniform, high brightness metal layers with good physical-mechanical characteristics on substrates.

Metal plating baths of the present invention may be employed to plate metal layers on any substrate that may be metal plated. Metal plating methods of the present invention involve passing a current between two electrodes, a cathode and an anode, immersed in a bath containing dissolved plating metal, bath additives and one or more additive consumption inhibiting organic compounds of the present invention. Current is passed through the bath until a substrate is plated with a desired thickness of metal.

The additive consumption inhibiting organic compounds and methods of the present invention may be employed in any industry where metal plating is used. For example, the metal plating baths may be employed in the manufacture of electrical devices such as printed circuit and wiring boards, integrated circuits, electrical contact surfaces and connectors, electrolytic foil, silicon wafers for microchip applications, semi-conductors and semi-conductor packaging, lead frames, optoelectronics and optoelectronics packaging, solder bumps such as on wafers, and the like. Also, the metal plating baths may be employed for metal plating decorative articles for jewelry, furniture fittings, automobile parts, sanitary appliances, and the like. Further, organic compounds of the present invention may be employed in waste treatment methods.

The present invention also includes an apparatus composed of an electrical power source, an anode, a cathode, and a metal plating bath containing the additive consumption inhibiting organic compounds of the present invention. The cathode of the apparatus is the article that is to be metal plated. The apparatus may be a vertical or a horizontal metal plating apparatus.

A primary objective of the present invention is to provide organic compounds that inhibit degradation of additives in a metal plating bath.

Another objective of the present invention is to provide a metal plating bath that has a long life.

An additional objective of the present invention is to provide for an efficient method for plating a metal on a substrate.

A further objective of the present invention is to provide a method for plating a uniform, high brightness metal layer with good physical-mechanical properties on a substrate.

Still yet, an additional objective of the present invention is to provide an apparatus containing a metal plating bath with an organic compound that inhibits additive consumption.

Additional objectives and advantages may be ascertained by a person of skill in the art after reading the detailed description of the invention and the appended claims.

DETAILED DESCRIPTION OF THE INVENTION

Metal plating baths of the present invention contain organic compounds that inhibit the degradation of additives added to metal plating baths to improve metal deposition on a substrate. Such organic compounds include organic compounds having the following formula:

where R, $R^1$, $R^2$, and $R^3$ are each independently selected from hydrogen; halogen; ($C_1$–$C_{20}$) linear, branched, or cyclic alkyl; ($C_2$–$C_{20}$) linear, branched, or cyclic alkenyl; ($C_2$–$C_{20}$) linear, or branched alkynyl; sulfonyl halide; —CN; —SCN; —C=NS; —SH; —NO$_2$; —SO$_2$H; —SO$_3$M; —PO$_3$M; —P(R$^4$)$_2$, where $R^4$ is hydrogen or halogen; ($C_1$–$C_{20}$) alkyl-O($C_2$–$C_3$O)$_x$R$^6$, ($C_1$–$C_{12}$) alkylphenyl-O($C_2$–$C_3$O)$_x$R$^6$, or phenyl-O($C_2$–$C_3$O)$_x$R$^6$, where x is an integer of from 1–500 and $R^6$ is hydrogen, ($C_1$–$C_4$)alkyl or phenyl; silyl; silane; —Si(OH)$_3$; aminyl; aminyl halide; hydroxyaminyl; acyl halide; —COR$^5$, where $R^5$ is —OH, or ($C_1$–$C_{20}$) linear, branched or cyclic alkyl, ($C_2$–$C_{20}$) linear, branched, or cyclic alkenyl, ($C_2$–$C_{20}$) linear, or branched alkynyl, ($C_1$–$C_{20}$) linear, or branched alkoxy; or R, $R^1$, $R^2$, and $R^3$ are each independently —OH with the proviso that when hydroxyl is a substituent the compound also has a carboxyl group; the ($C_1$–$C_{20}$) alkyl, the ($C_2$–$C_{20}$) alkenyl, the ($C_2$–$C_{20}$) alkynyl, and the ($C_1$C$_{20}$) alkoxy groups may be unsubstituted or substituted; M is hydrogen or an alkali metal such as Li, Na, K, Rb, or Cs. Halogens include F, Cl, Br, or I.

$R^1$ and $R^2$ may be taken together to form a carbon-carbon bond; or $R^1$ and $R^2$ may be taken together to form a 5 to 7 membered carbocyclic ring, or a 5 to 7 membered carbocyclic ring fused with one or more five or six membered rings. The 5 to 7 membered carbocyclic ring and the one or more five or six membered fused rings may each contain one or more carbonyls in the ring. The 5 to 7 membered rings and the five or six membered fused rings may each optionally contain a hetero-atom such as oxygen or nitrogen to form one or more heterocyclic rings. The heterocyclic rings may contain a carbonyl in the ring. The 5 to 7 membered rings, the five to six membered fused rings, and the heterocyclic rings may be unsubstituted or substituted.

The ($C_1$–$C_{20}$) alkyl, the ($C_2$–$C_{20}$) alkenyl, the ($C_2$–$C_{20}$) alkynyl, the ($C_1$–$C_{20}$) alkoxy, the 5 to 7 membered rings, the 5 to 6 membered fused rings and the heterocyclic rings may be substituted with one or more substituents which include, but are not limited to, halogen, —Si(OH)$_3$, silane, silyl, aryl, alkoxy, —SO$_3$M, —PO$_3$M, sulfonyl halide, —SO$_2$H, NO$_2$, —CN, —SCN, —C=NS, —P($R^4$)$_2$, ester containing group, —SH, aminyl, aminyl halide, hydroxyaminyl, acyl halide, carboxyl, keto, or —OH. A hydroxyl group is included as a substituent on an additive consumption inhibiting compound of the present invention with the proviso that the additive consumption inhibiting compound also has at least one carboxyl group. $R^4$ and M are as defined above. The cyclic alkenyl groups and the aryl radical include, but are not limited to, phenyl, naphthyl, anthryl, phenanthryl, furanyl, pyridinyl, and pyrimidinyl radicals. Substitution within the scope of the present invention means that a hydrogen is replaced with a substituent such as the substituent groups mentioned above.

The organic additive consumption inhibiting compounds of the present invention also include salts, hydrates and acid anhydrides of the foregoing compounds. Such salts include, but are not limited to, alkali metal salts of acids.

Preferred compounds of the present invention are aromatic compounds as well as compounds with triple bonds. Such compounds are where at least one of R, $R^1$, $R^2$, or $R^3$ is ($C_5$–$C_{20}$) cyclic alkenyl, or where $R^1$ and $R^2$ are taken together to form a bond, or where $R^1$ and $R^2$ are taken together to form a 5 to 7 membered ring, a 5 to 7 membered ring fused with one or more 5 or 6 membered ring, or a 5 to 7 membered heterocyclic ring fused with one or more 5 to 6 membered ring, or a 5 to 7 membered heterocyclic ring fused with one or more 5 to 6 membered heterocyclic ring. The foregoing rings are sufficiently unsaturated to form one or more aromatic ring and may be unsubstituted or substituted with the substituent groups recited above. Especially preferred compounds for practicing the present invention are aromatic compounds with at least one carboxyl substituent. Most preferred compounds for practicing the present invention are unsaturated compounds with at least one carboxyl group and at least one hydroxyl group, especially aromatic compounds.

Examples of especially preferred acids, salts of acids and hydrates thereof include 2,6-dihydroxybenzonic acid, 4-hydroxybenzoic acid resorcinol, 2,3-dihydroxybenzoic acid, 2,4-dihydroxybenzoic acid, 2,4,6-trihydroxybenzoic acid, 2,3,4-trihydroxybenzoic acid, methyl-3,4,5-trihydroxybenzoate, methyl-2,4-dihydroxybenzoate, and 4-hydroxymandelic acid monohydrate.

Examples of other suitable acids and anhydrides include 3-(phenylthio) acetic acid, 4-hydroxybenzene sulfonic acid, gallic acid, 4-vinylbenzoic acid, 3,4-dihydroxy cinnamic acid, 4-methoxy cinnamic acid, 2-hydroxy cinnamic acid, phthalic acid, trans-3-furanyl acrylic acid, vinyl acetic acid, and sulfanilic acid. Also included are acid anhydrides such as phthalic anhydride.

Examples of other suitable organic compounds within the scope of the present invention include aromatic hydrocarbons, unsubstituted or substituted, such as phenyl methyl and the like.

The additive consumption inhibiting organic compounds may be employed in metal plating baths for plating copper, gold, silver, palladium, platinum, cobalt, chromium, cadmium, bismuth, indium, rhodium, iridium, and ruthenium. Preferably, the foregoing compounds may be employed in metal plating baths for plating metals selected from the group consisting of copper, gold, silver, platinum, palladium, iridium, and ruthenium. More preferably the foregoing additive consumption inhibiting compounds are employed in baths for plating metals selected from copper, iridium, or ruthenium. Most preferably, the foregoing additive consumption inhibiting compounds are employed in plating baths for plating copper.

Adding one or more of the additive consumption inhibiting organic compounds of the present invention to metal plating baths prevent or reduce the degradation of additives in the metal plating baths. Preferably, the metal plating baths are electroplating baths. Preferably the metal plating baths of the present invention are aqueous. The additive consumption inhibiting organic compounds are added in amounts of generally from about 0.001 g/L to about 100 g/L of bath. Preferably, the organic compounds are generally employed in plating baths of from about 0.01 g/L to about 20.0 g/L.

The additive consumption inhibiting organic compounds may be added to plating baths by any suitable method employed to add components to a bath. One method is to mix the organic compounds into the plating bath with the other bath components and additives.

Additives that the organic compounds inhibit degradation of include, but are not limited to, brighteners, levelers, hardeners, wetting agents, malleability, ductility and deposition modifiers, suppressants and the like. Such additives are predominantly organic compounds. The additive consumption inhibiting organic compounds are especially effective in inhibiting consumption of brighteners and levelers. Additives as defined within the scope of the present invention include any compound, salt or liquid that may be added to a metal plating bath with the exception of a consumption inhibiting organic compounds of the present invention.

While not being bound to any theory, the additive consumption inhibiting organic compounds of the present invention are believed to inhibit additive consumption by one or a combination of the following mechanisms. Many additives break down or decompose at the anode to oxidation products. The organic compounds of the present invention may competitively adsorb onto an anode over additives, and become oxidized in place of the additives. Many metal plating baths contain chloride. Chloride is often added to metal plating baths in the form of HCl. Chloride is oxidized at the anode to chlorine. Chlorine may then oxidize the bath additives reducing the effectiveness of the additives in the metal plating bath. By adding one or more of the additive consumption inhibiting compounds to the metal plating bath, chlorine oxidizes the one or more organic compounds over the additives. In other words, the additive consumption inhibiting organic compounds may perform as sacrificial species. In another proposed mechanism, the additive consumption inhibiting organic compounds compete with chloride, or with both chloride and the additives at the anode surface. Thus, the additive consumption inhibiting organic compounds are oxidized at the anode over the chloride, or both the chloride and the additives.

Examples of suitable brighteners employed in plating baths of the present invention, include but are not limited to, compounds that contain structural formulas: HO$_3$S—$R^{11}$—SH, HO$_3$S—$R^{11}$—S—S—$R^{11}$—SO$_3$H, where $R^{11}$ is $C_1$–$C_6$ or an aryl group, and HO$_3$S—Ar—S—S—Ar—SO$_3$H, where Ar is phenyl or naphthyl. Substituents of the alkyl and aryl groups may be, for example, alkyl, halo and alkoxy. Examples of such brightening agents are 3-mercaptopropylsulfonic acid (sodium salt), 2-mercaptoethanesulfonic acid (sodium salt), and bissulfopropyl disulfide (BSDS). Such compounds are disclosed in U.S. Pat. Nos. 3,770,598, 4,374,709, 4,376,685, 4,555,315 and 4,673, 469, all incorporated herein in their entirety by reference. Such polysulfides also may be employed to increase ductility of deposited metal.

Examples of levelers that may be employed in a plating bath include, but are not limited to, alkylated polyalkyleneimines and organic sulfo sulfonates. Examples of such compounds include 1-(2-hydroxyethyl)-2-imidazolidinethione (HIT), 4-mercaptopyridine, 2-mercaptothiazoline, ethylene thiourea, thiourea and alkylated polyalkyleneimine. Such compounds are disclosed in U.S. Pat. Nos. 4,376,685, 4,555,315, and 3,770,598, the disclosures of which are hereby incorporated herein in their entireties by reference.

Examples of other additives that may function as brighteners in plating baths within the scope of the present invention include, but are not limited to, sulfur compounds such as 3-(benzthiazoyl-2-thio)-propylsulfonic acid sodium salt, 3-mercaptopropane-1-sulfonic acid sodium salt, ethylenedithiodipropylsulfonic acid sodium salt, bis-(p-sulfophenyl)-disulfide disodium salt, bis-($\omega$-sulfobutyl)-disulfide disodium salt, bis-($\omega$-sulfohydroxypropyl)-disulfide disodium salt, bis-($\omega$-sulfopropyl)-disulfide disodium salt, bis-($\omega$-sulfopropyl)-sulfide disodium salt, methyl-($\omega$-sulfopropyl)-disulfide sodium salt, methyl-($\omega$-sulfopropyl)-trisulfide disodium salt, O-ethyl-dithiocarbonic acid-S-($\omega$-sulfopropyl)-ester, potassium salt thioglycolic acid, thiophosphoric acid-O-ethyl-bis-($\omega$-sulfpropyl)-ester disodium salt, thiophosphoric acid-tris($\omega$-sulfopropyl)-ester trisodium salt, N,N-dimethyldithiocarbamic acid (3-sulfopropyl)ester, sodium salt (DPS), (O-ethyldithiocarbonato)-S-(3-sulfopropyl)-ester, potassium salt (OPX), 3-[(amino-iminomethyl)-thio]-1-propanesulfonic acid (UPS), 3-(2-benzthiazolylthio)-1-propanesulfonic acid, sodium salt (ZPS), thiol of bissulfopropyl disulfide (MPS) and the like.

Examples of oxygen containing high molecular weight compounds that may be employed as suppressors include carboxymethylcellulose, nonylphenolpolyglycol ether, octandiolbis-(polyalkylene glycolether), octanolpolyalkylene glycolether, oleic acidpolyglycol ester, polyethylenepropylene glycol, polyethylene glycol, polyethylene glycoldimethylether, polyoxypropylene glycol, polypropylene glycol, polyvinylalcohol, stearic acidpolyglycol ester, stearyl alcoholpolyglycol ether, and the like.

Aromatic and aliphatic quaternary amines also may be added to plating baths to improve deposit brightness. Dyes of the phenazine class (Safranine type) and phenazine azo dyes (Janus Green B type) may be employed as levelers. Polyethers are used to improve thickness and uniformity of metal plating.

Brighteners and levelers are added to plating baths in amounts of from about 1 part per billion to about 1 g/L of bath. More often, brighteners and levelers range from about 10 parts per billion to about 500 parts per million. Ranges for bath components may vary from one bath composition to the next. Thus, the foregoing weight ranges for the additives are general ranges.

Examples of suitable wetting agents or surfactants that may be employed in plating baths of the present invention include nonionic surfactants such as alkyl phenoxy polyethoxyethanols. Other suitable wetting agents containing multiple oxyethylene groups also may be employed. Such wetting agents include compounds of polyoxyethylene polymers having from as many as 20 to 150 repeating units. Such compounds also may perform as suppressors. Also included in the class of polymers are block copolymers of polyoxyethylene and polyoxypropylene. Surfactants and wetting agents are added in conventional amounts.

In addition to the additives, other plating bath components are included in plating baths as a source of metal ions, pH adjusters, such as inorganic acids, and a source of halide ions. Generally, plating baths are aqueous. The pH range of the baths may range from 0 to about 14, preferably from 0 to about 8. Wetting agents employed in plating baths and amounts employed in such baths are well known in the art. Inorganic acids employed include, but are not limited to, sulfuric acid, hydrochloric acid, nitric acid, phosphoric acid and the like. Sulfuric acid is a preferred acid. Halogen ions are optional. Halogen ions employed in plating baths preferably include chloride, fluoride, and bromide. Such halides are added into the bath as a water soluble salt. Chloride is preferred, and is introduced into the bath, preferably, as HCl. Water soluble salts of metals provide a source of the metal to be plated on a substrate. Such water soluble salts include metal salts of copper, chromium, gold, silver, cadmium, platinum, palladium, cobalt, bismuth indium, rhodium, ruthenium, and iridium.

The most preferred selected metal to be plated with the baths of the present invention consists of copper. Preferably, the copper is electroplated. Copper that is useful may be in the form of any solution soluble copper compound. Suitable copper compounds include, but are not limited to, copper halides, copper sulfates, copper alkane sulfonate, copper alkanol sulfonate, and the like. When copper halide is used, chloride is the preferred halide. Preferred copper compounds are copper sulfate, copper alkane sulfonate, or mixtures thereof. The more preferred are copper sulfate, copper methane sulfonate or mixtures thereof. Copper compounds useful in the present invention are generally commercially available or may be prepared by methods known in the literature. When copper is plated on a substrate the pH of the bath may range from 0 to about 14.0. Preferably the bath ranges from a pH of from 0 to about 8.0.

Metal ions range in concentration in the plating baths of from about 0.010 g/L to about 200 g/L, preferably from about 0.5 g/L to about 100.0 g/L. When copper is employed the amount of copper may range from about 0.01 to about 100 g/L. Preferably, copper ranges from about 0.10 g/L to about 50 g/L. When the bath of the present invention is used in a non-high speed plating process, the amount of copper present in the bath ranges from about 0.02 g/L to about 25 g/L. When the bath of the present invention is used in a high speed plating process, the amount of copper present in the bath ranges from about 1.0 g/L to about 100 g/L, preferably from about 2.0 g/L to about 50 g/L.

Halide ions range in concentration of from 0 mg/L to about 1 g/L, preferably from about 1.0 mg/L to about 150 mg/L. Acids are added to the plating baths to obtain a pH range of from about 0 to about 8.0. Accordingly, acids are added in amounts of from about 10 g/L to about 600 g/L, preferably from about 15 g/L to about 500 g/L.

An example of an acid copper electroplating bath for practicing the present invention has a composition as follows:

| | |
|---|---|
| Copper Ions (as Copper Sulfate) | 0.01 to 50 g/L |
| Sulfuric Acid (Concentrated) | 15 to 500 g/L |
| Chloride Ions (as Sodium Chloride) | 1 ppm to 150 ppm |
| Additives | As Required |
| Additive Preserving Compound | 0.1 to 10 g/L |
| Water | To 1 liter |

While the organic compounds of the present invention may be employed to prevent degradation of additives in any suitable plating bath where a substrate is to be metal plated, preferably, the additive consumption inhibiting compounds are employed in electroplating baths. Such electroplating baths are employed in electrodeposition of a metal on a substrate such as in the manufacture of printed wiring boards and silicon wafers used in microchip applications, and in the manufacture of other components for electrical devices. Electroplating processes involve passing current through an anode, an electroplating solution, and a cathode for a sufficient amount of time to metal plate a substrate to a desired thickness. The anode may be a soluble anode (composed of a metal such as copper that dissolves and replenishes the electroplating bath as plating occurs). Alternatively, an insoluble anode (composed of an inert material such as platinum, platinized titanium, lead, and the like) may be employed where electroplating rates are greater than in methods using soluble anodes. Preferably, the present invention is employed in plating processes employing an insoluble anode where problems associated with additive consumption (often oxidation at the anode) are greater than with processes employing soluble anodes.

Examples of useful insoluble anodes are anodes that have surfaces with oxides of iridium and tantalum. Such anodes have from about 20 to about 90 moles percent of iridium with the remainder tantalum. Preferred is about 60 to about 90 mole percent of iridium with the remainder tantalum. The anodes are made by coating iridium and tantalum on a conducting substrate such as a titanium substrate.

Other suitable anodes include anodes composed of at least about 10 mole percent of group VIII metals, at least about 10 mole percent valve metal and at least about 5 mole percent binder metal. Group VIII metals include cobalt, nickel, ruthenium, rhodium, palladium, iridium and platinum. Valve metals include titanium, zirconium, hafnium, vanadium, niobium and tantalum. Binder metals include beryllium, calcium, strontium, barium, scandium, yttrium, lanthanum and rare earth elements with atomic numbers 58 through 71. Especially useful is an oxide composition with from about 5 to about 20 mole percent of barium, and the ratio of iridium to tantalum between about 1/4 and about 4. Such a composition is about 5 mole percent barium, from about 30 to about 40 mole percent iridium with the remainder tantalum. Additionally, osmium, silver and gold or their oxides may be employed in insoluble anodes.

As mentioned above, plating baths of the present invention may be employed in any suitable plating process where metal is plated on a substrate. Plating baths of the present invention are especially suitable for plating substrates in the manufacture of electronic devices such as in the printed wiring board industry and the manufacture of silicon wafers in microprocessing.

In an electroplating process, the substrate to be plated is used as a cathode. A soluble or preferably an insoluble anode, as described above, is employed as a second electrode. A process of pulse plating, direct current (DC) plating, or a combination of DC and pulse plating may be employed. Such plating methods are known in the art. Current densities and electrode surface potentials may vary depending on the specific substrate to be plated. Generally, anode and cathode current densities may vary from about 1 to about 1000 amps/ft$^2$ (ASF). Plating baths are maintained in a temperature range of from about 20° C. to about 110° C. Temperature ranges for specific metals vary. Copper baths are maintained in a temperature range of from about 20° C. to about 80° C. with acid copper baths at temperatures of from about 20° C. to about 50° C. Plating is continued for a time sufficient to form a deposit of desired thickness. Generally, plating time for a circuit board is from about 45 minutes to about 8 hours. For circuit board manufacture, a desired thickness may range from about 0.5 to about 3.0 mils. More often layer thickness ranges from about 1.0 to about 1.5 mils.

Both vertical and horizontal plating processes may be employed. In the vertical process, the substrate, such as a printed circuit or wiring board, is sunk in a vertical position into a container containing a plating bath solution of the present invention. The substrate, which functions as a cathode, is situated in the vertical position opposite at least one anode, preferably an insoluble anode. The substrate and the anode are connected to a current source. Instead of regulating the current with the current source, there also can be a voltage arrangement where the voltage between the substrate and the anode is regulated. Plating solution is directed continuously through the container by means of transporting equipment such as a pump.

Figure 1:
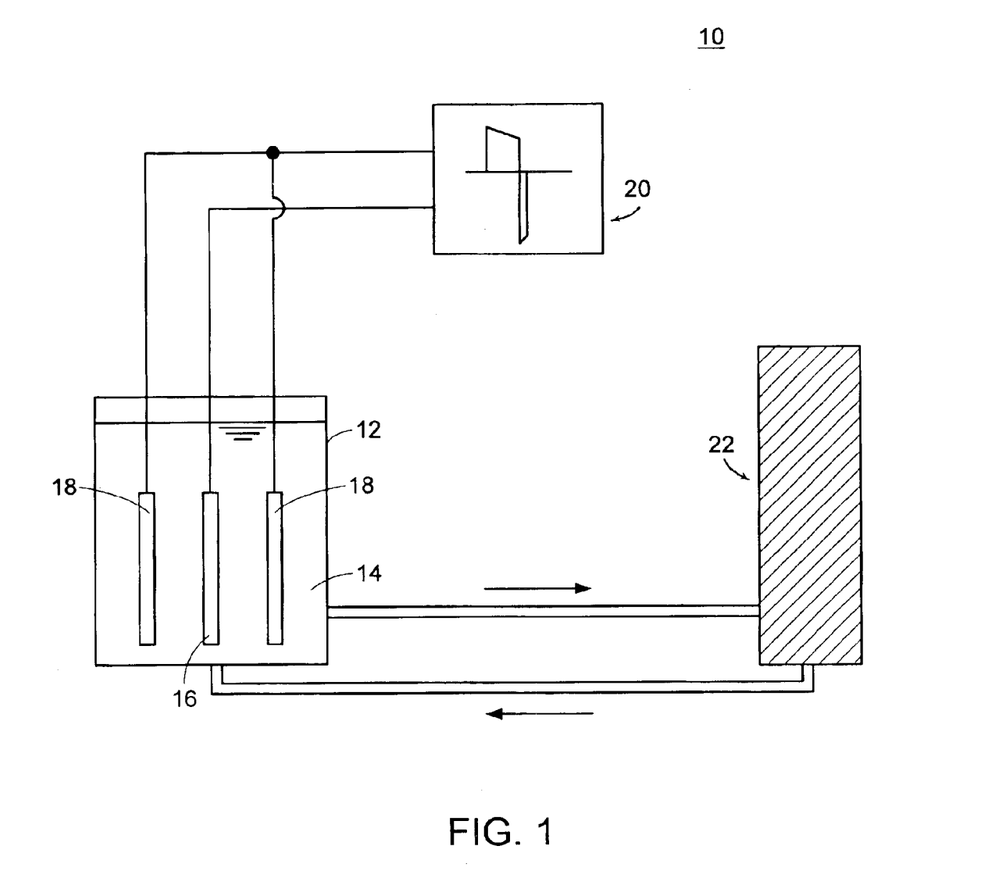
FIG. 1 is a diagrammatic illustration for treating a workpiece by a vertical method in accordance with the present invention.

An example of an arrangement that is suitable for treating a substrate or workpiece by a vertical method and apparatus is represented in FIG. 1. Apparatus 10 is composed of container 12 with metal plating bath 14 that contains an additive consumption inhibiting organic compound or the present invention. The metal plating bath 14 may be used, for example, for copper plating and contains previously mentioned components and additives.

Workpiece 16 (cathode), for example a circuit board, and anodes 18, for example insoluble titanium anodes coated with iridium dioxide, are immersed into metal plating bath 14. Workpiece 16 and anodes 18 are connected electrically to current source 20. Instead of regulating the current with the current source, a voltage arrangement (not shown) may be used to regulate voltage between the workpiece 16 and anodes 18. Metal plating bath 14 is directed continuously to second container or reservoir 22 by a transporting means (not shown) such as a pump. Reservoir 22, which metal plating bath 14 flows through, replenishes metal bath components and additives in metal plating bath 14 such as copper salts, brighteners, levelers, additive consumption inhibiting organic compounds and the like.

In the horizontal plating process, the substrate is transported through a conveyorized unit in a horizontal position with a horizontal direction of movement. Plating bath is injected continuously from below and/or from above onto the substrate by means of splash nozzles or flood pipes. The anodes are arranged at a spacing relative to the substrate and are brought into contact with the plating bath by means of a suitable device. The substrate is transported by means of rollers or plates.

Figure 2:
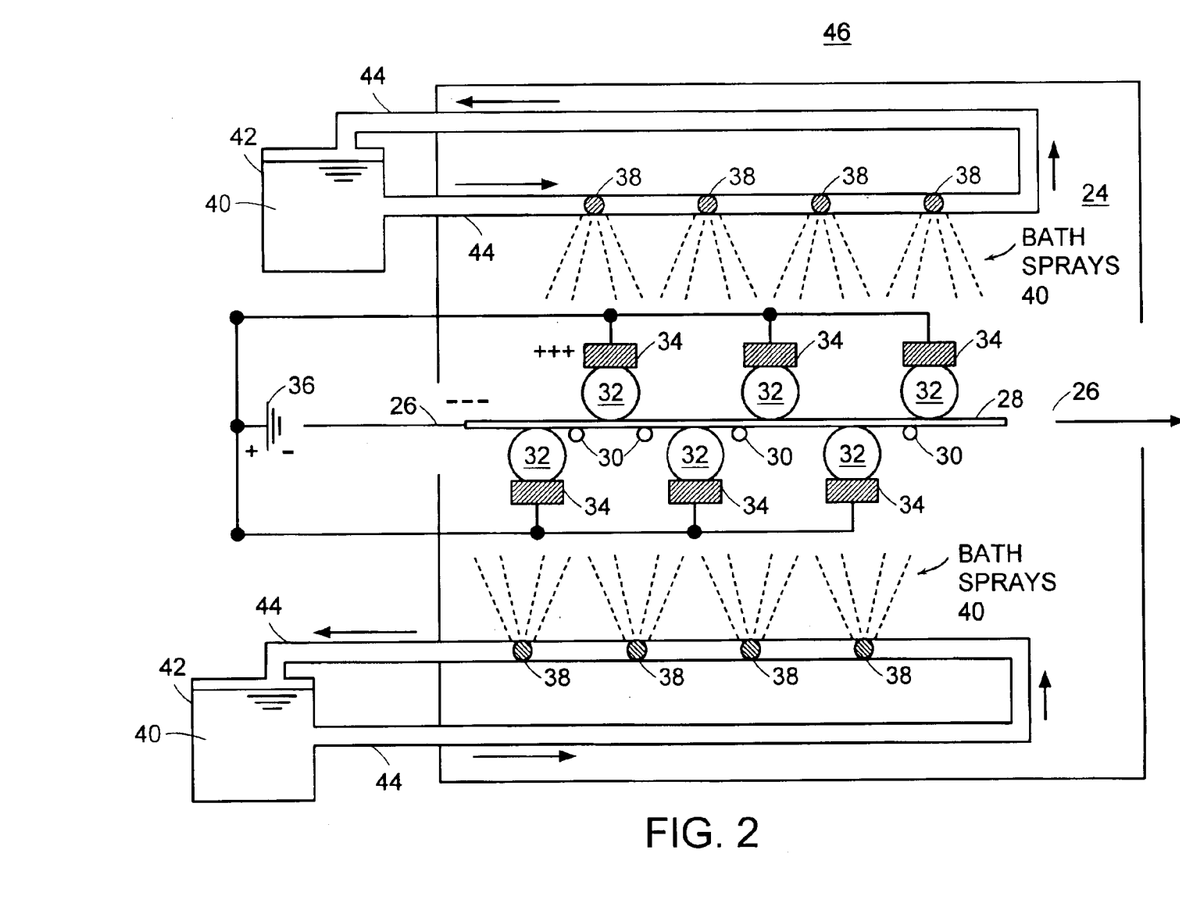
FIG. 2 is a diagrammatic illustration of an apparatus for treating a workpiece by a horizontal method in accordance with the present invention.

An example of a horizontal method and apparatus that may be employed to practice the present invention is illustrated in FIG. 2. Spray chamber 24 of apparatus 46 is formed with slots 26 at either end to allow for continuous conveyance of panel 28, such as a circuit board panel to be metal plated, to enter and leave chamber 24. While a circuit board panel is illustrated, any suitable surface that may be plated by a horizontal apparatus lies within the scope of the present invention. Panel 28 is supported for moving in the direction of the arrow by idler rollers 30. A series of roller brushes 32 is positioned to contact both upper and lower surfaces of panel 28 with a series of anodes 34 positioned to contact roller brushes 32 on the sides of idler rollers 30 away from panel 28. Anodes 34 are formed of any suitable metal such as titanium coated with iridium dioxide. While any suitable anode may be employed, an insoluble anode such as the titanium coated iridium dioxide anode is preferred. Anodes 34 are positioned such that the anodes touch the upper set of idler rollers 30 from above, and touch the lower set of idler rollers 30 from below. Anodes 34 are electrically connected in parallel to a positive terminal of power supply 36. A negative terminal of power supply 36 is connected to panel 28 (cathode) that is to be plated. Spray jets 38 which are connected to reservoir 42 containing metal plating bath 40 by means of lines 44 are arranged to spray metal plating bath 40 down on both anodes 34 and roller brushes 32 as well as panel 28 between roller brushes 32. Arrows show the path for the metal bath flow through lines 44. Metal plating bath 40 is pumped from reservoir 42 through lines 44 by a pumping means (not shown) in mechanical connection to reservoir 42. The transport mechanism means (not shown) for panel 28 is a conveyor-type mechanism that provides for a continuous movement of panel 28 through chamber 24 while maintaining electrical contact between the negative pole of power supply 36 and panel 28.

By preventing or substantially reducing the amount of additive breakdown, the additive consumption inhibiting organic compounds provide for improved brightness of plated metal and improved physical-mechanical properties of the plated metal. Metal layers plated with baths of the present invention are not brittle or powdery in structure. Also, metal layers plated with the baths of the present invention have good throwing power and no plating folds. Such properties for metal layers are especially desirable for through-holes in printed circuit and wiring boards. Additionally, because the compounds prevent or substantially reduce the amount of additives degraded during metal plating, replenishment of the organic additives is reduced in contrast to baths without the additive consumption inhibiting organic compounds. Also, prevention of additive breakdown permits metal plating operations to continue for longer periods without bath replacement. Further, because the organic compounds of the present invention inhibit degradation of additives, costly semi-permeable membranes can be eliminated from apparatus during plating. Thus, plating baths containing the additive consumption inhibiting compounds provide for a more efficient and economic method for metal plating than baths without the additive consumption inhibiting organic compounds. Accordingly, metal plating baths of the present invention provide for an improved metal plating process. All numerical ranges in the present application are inclusive and combinable.

While the present invention is described with an emphasis on electroplating processes in the printed wiring board industry, the present invention may be employed in any suitable plating process. The compounds may be employed in metal plating baths in the manufacture of electrical devices such as printed circuit and wiring boards, integrated circuits, electrical contact surfaces and connectors, electrolytic foil, silicon wafers for microchip applications, semiconductors and semi-conductor packaging, lead frames, optoelectronics and optoelectronic packaging, solder bumps such as on wafers, and the like. Additionally, the metal plating baths may be employed for metal plating decorative articles for jewelry, furniture fittings, automobile parts, sanitary appliances, and the like. Further, the additive consumption inhibiting compounds of the present invention may be employed in waste treatment methods.

The following examples are provided to better describe the present invention, and are not intended to limit the scope of the invention.

EXAMPLE 1

Compounds within the scope of the present invention were tested for their ability to prevent brightener consumption in a copper plating bath. Hydrodynamically controlled Hull Cells were used to measure the ability of a compound to prevent brightener consumption. A compound's ability to prevent brightener consumption was measured by recording the number of fully bright cathodes produced in the about 5–90 ASF current density range without replenishing the brightener.

The copper plating bath employed in the tests was as follows:

| Bath Component | Amount |
|---|---|
| Copper Sulfate Pentahydrate | 80 g/L |
| Sulfuric Acid (Concentrated) | 225 g/L |
| Chloride (as sodium chloride) | 50 ppm |
| Polyethylene Oxide (suppressor) | 1 g/L |
| Bissulfopropyl Disulfide (brightener) | 1 ppm |
| Water | To 1 L |

Compounds tested are disclosed in the table below along with the results. Each compound was added to the plating baths in an amount of about 1 g/L. A control bath with no brightener protecting additives was also tested. Each Hull Cell experiment was performed with copper clad FR4/glass-epoxy functioning as the cathode, and iridium dioxide coated titanium mesh functioning as the anode (insoluble anode). The cathode was electroplated at about 3 amps for about 10 minutes with a DC rectifier. After about 10 minutes, if the cathode deposit was bright in the about 5–90 ASF current density range, then a new copper cathode was immersed and electroplated. The process was repeated until the cathode deposit was matte in the about 5–90 ASF current density range. About 7 g of copper sulfate heptahydrate was added about every 30 minutes to the plating baths to replenish copper ions. When a matte deposit was recorded, the brightener was depleted from the bath.

The plating bath control without any brightener protecting additives produced zero bright cathodes in the about 5–90 ASF current density range. The number of consecutive bright cathodes produced from a number of different brightener protecting compounds is listed in the following table:

| Compound | Number of Bright Hull Cells |
|---|---|
| 2,4,6-trihydroxybenzoic acid | 7 |
| 2,4-dihydroxybenzoic acid | 6 |
| 2,3-dihydroxybenzoic acid | 3 |
| 4-hydroxybenzoic acid | 3 |
| 2,6-dihydroxybenzoic acid | 3 |
| Vinyl acetic acid | 3 |
| Control (no compound added) | Less than 1 |

Best results were obtained with the aromatic acid with hydroxyl substitution at the 2, 4 and 6 carbons and at the 2 and 4 carbons. All the compounds tested showed some brightener consumption inhibition in contrast with the control that was composed of only the copper bath components. Thus, the compounds listed above may be added to a copper plating bath to inhibit brightener consumption.

EXAMPLE 2

Compounds within the scope of the present invention were tested for their ability to prevent brightener consumption in a copper plating bath. Hydrodynamically controlled Hull Cells were used to measure the ability of a compound to prevent brightener consumption. A compound's ability to prevent brightener consumption was measured by recording the number of fully bright cathodes produced in an about 5–90 ASF current density range without replenishing the brightener.

The copper plating bath employed in the tests was as follows:

| Bath Component | Amount |
|---|---|
| Copper Sulfate Pentahydrate | 80 g/L |
| Sulfuric Acid (Concentrated) | 225 g/L |
| Chloride (as sodium chloride) | 50 ppm |
| Polyethylene Oxide (suppressor) | 1 g/L |
| Bissulfopropyl Disulfide (brightener) | 1 ppm |
| Water | To 1 L |

Compounds tested are disclosed in the table below along with the results. Each compound was added to the plating baths in an amount of about 0.1 g/L. A control bath with no brightener protecting additives was also tested. Each Hull Cell experiment was performed with copper clad FR4/glass-epoxy functioning as the cathode, and iridium dioxide coated titanium mesh functioning as the anode (insoluble anode). The cathode was electroplated at about 3 amps for about 10 minutes with a DC rectifier. After about 10 minutes, if the cathode deposit was bright in the about 5–90 ASF current density range, then a new copper cathode was immersed and electroplated. The process was repeated until the cathode deposit was matte in the about 5–90 ASF current density range, up to a total of about thirty minutes of plating time, i.e., three consecutive bright Hull Cell panels. When a matte deposit was recorded, the brightener was depleted from the bath.

The plating bath control without any brightener protecting additives produced zero bright cathodes in the about 5–90 ASF current density range. The number of consecutive bright cathodes produced from a number of different brightener protecting compounds is listed in the following table:

| Compound | Number of Bright Hull Cells |
|---|---|
| 2,4,6-trihydroxybenzoic acid monohydrate | 3 |
| 2,3-dihydroxybenzoic acid | 3 |
| 4-hydroxybenzoic acid | 3 |
| 2,4-dihydroxybenzoic acid | 3 |
| 2,6-dihydroxybenzoic acid | 3 |
| 2,3,4-trihydroxybenzoic acid | 3 |
| Hexadienoic acid | 1 |
| Trans-1-pentanoic acid | 1 |
| 4-vinylbenzoic acid | 1 |
| Control (free of consumption inhibiting compound) | Less than 1 |

All of the compounds that were tested showed some brightener consumption inhibition in contrast to the control bath that was composed of only the copper bath components. However, best results were obtained from compounds that were aromatic and contained carboxyl and hydroxyl substituents. Such compounds produced 3 bright Hull Cells. In contrast, compounds that did not have at least one hydroxyl group and a carboxyl group produced only 1 bright Hull Cell.

EXAMPLE 3

The following comparative tests showed that the brightener consumption inhibiting compounds of the present invention are an improvement over iron redox methods for inhibiting brightener consumption.

Four metal plating baths were prepared all composed of about 80 g/L of copper sulfate pentahydrate, about 225 g/L of sulfuric acid, about 1 g/L of polyeththylene oxide and about 1 ppm of bissulfopropyl disulfide (brightener). Iron (II) sulfate heptahydrate was added to three of the four baths in different quantities. One bath contained iron (II) sulfate heptahydrate in an amount of about 1 g/L, the second bath contained about 10 g/L of iron (II) sulfate heptahydrate and the third bath contained about 200 g/L of iron (II) sulfate heptahydrate. The iron (II) sulfate heptahydrate was added to each of the baths to test the iron (II) sulfate heptahydrate's ability to prevent brightener consumption during plating copper onto copper clad FR4/glass-epoxy panels in a standard Hull Cell. The fourth bath was a control bath. The Hull Cell contained an iridium dioxide ($IrO_2$) mesh-type insoluble anode. The copper clad FR4/glass-epoxy panel functioned as the cathode. Each Hull Cell was operated at about 3 amps for about 10 minutes.

After about 10 minutes of electroplating in the presence of varying degrees of iron (II) sulfate, no fully bright panels were produced with a current density of about 5–90 ASF. Thus, significant amounts of brightener were consumed during plating. However, a slight improvement in protecting brightener was noted when the current density was in the about 0–12 ASF range. Semi-bright panels were produced. The control panel without iron had a semi-bright surface when the current density was reduced to about 0–60 ASF range.

The additive consumption inhibiting compounds of Example 1 above showed improved brightener protection in contrast to iron salts at a current density of about 5–90 ASF. The brightener in the plating bath with the iron salts and in the control bath was substantially consumed after about 10 minutes resulting in no fully bright panels in contrast to the plating baths of Example 1 where the addition of the additive consumption inhibiting compounds to the plating baths produced numerous bright panels.

EXAMPLE 4

Other transition metals in addition to iron were tested for their ability to prevent brightener consumption in acid copper plating baths.

Five baths were prepared with about 80 g/L of copper sulfate pentahydrate, about 225 g/L of sulfuric acid, about 1 g/L of polyethylene oxide and about 1 ppm of bissulfopropyl disulfide (brightener). One bath contained about 10 g/L of $Na_2MoO_4$, a second bath contained about 10 g/L of $MnSO_4$, a third bath contained about 1 g/L of $MnSO_4$ and a fourth bath contained about 1 g/L of $TeO_2$. A fifth bath acted as a control and contained no transition metal compounds. Brightener consumption was tested in Hull Cells employing copper clad FR4/glass-epoxy panels as the cathode and an IrO2 coated titanium anode. Electroplating was performed for about 10 minutes at about 3 amps using a DC rectifier with air agitation. Current density was in the range of about 5–90 ASF.

Although the baths containing the transition elements produced panels that were semi-bright in contrast to the control panel, none of the baths produced fully bright cathodes in the about 5–90 ASF current density range. Just as with the iron (II) sulfate of Example 3, the baths containing the transition metal salts provided copper deposits that were slightly brighter than the control.

The additive consumption inhibiting compounds of the present invention as shown in Example 1 above had improved brighter preservation activity in contrast to the transition metal salts of the present example. Several fully bright panels were produced with plating baths containing the additive consumption inhibiting compounds of Example 1 in contrast to none with baths containing the transition elements.

What is claimed is:

1. A metal plating bath comprising an additive consumption inhibiting organic compound with a formula as follows:

wherein R, $R^1$, $R^2$ and $R^3$ independently comprise hydrogen; halogen; ($C_1$–$C_{20}$) linear, branched, or cyclic alkyl; ($C_2$–$C_{20}$) linear, branched, or cyclic alkenyl; ($C_2$–$C_{20}$) linear or branched alkynyl; —CN; —SCN; —C=NS; —SH; —$NO_2$; —$SO_2H$; —$SO_3M$; $PO_3M$; ($C_1$–$C_{20}$) alkyl-O($C_2$–$C_3$O)$_x$$R^6$, ($C_1$–$C_{12}$) alkylphenyl-O($C_2$–$C_3$O)$_x$$R^6$, -phenyl-O($C_2$–$C_3$O)$_x$$R^6$, where x is an integer of from 1–500 and $R^6$ is hydrogen; ($C_1$–$C_4$) alkyl or phenyl; —P($R^4$)$_2$, where R4 is hydrogen or halogen; silane; silyl; Si(OH)$_3$; sulfonyl halide; acyl halide; aminyl; aminyl halide; —$COR^5$, where $R^5$ is —OH, or ($C_1$–$C_{20}$) linear branched or cyclic alkyl, ($C_2$–$C_{20}$) branched, linear or cyclic alkenyl, ($C_2$–$C_{20}$) linear or branched alkynyl, ($C_1$–$C_{20}$) linear or branched alkoxy; or —OH with the proviso that a carboxy is present as a substituent on the compound; the ($C_1$–$C_{20}$) alkyl, ($C_2$–$C_{20}$) alkenyl, and the ($C_2$–$C_{20}$) alkynyl groups may be unsubstituted or substituted; M is hydrogen or an alkali metal; or $R^1$ and $R^2$ are taken together to form a chemical bond; or $R^1$ and $R^2$ are taken together along with atoms to which they are attached to form a 5 to 7 membered ring, or to form a 5 to 7 membered heterocyclic ring where oxygen or nitrogen are hetero-atoms in the ring, the 5–7 membered ring or the 5–7 membered heterocyclic ring may comprise one or more carbonyl groups; the 5 to 7 membered ring or the 5 to 7 membered heterocyclic ring may be fused with one or more five or six membered rings, the one or more five or six membered rings may contain one or more oxygen or nitrogen atoms, the fused rings may contain a carbonyl in the ring; the 5 to 7 membered ring, the one or more five or six membered fused ring, and the heterocyclic rings may be unsubstituted or substituted with one or more of halogen, silane, silyl, aryl, alkoxy, —Si(OH)$_3$, —CN, —SCN, —C=NS, —SH, —$NO_2$, —$SO_2H$, sulfonyl halide, acyl halide, aminyl, hydroxyaminyl, aminyl halide, —$PO_3M$, —P($R^4$)$_2$, carboxyl, keto, ester containing group, or —OH, with the proviso that when —OH is a substituent a carboxyl substituent is present on the compound, M is hydrogen or an alkali metal, and $R^4$ is hydrogen or halogen; and a salt of a metal selected from metals consisting of copper, gold, silver, palladium, platinum, cadmium, chromium, bismuth, indium, iridium, and ruthenium.

2. The metal plating bath of claim 1, wherein the ($C_1$–$C_{20}$) alkyl, ($C_2$–$C_{20}$) alkenyl, ($C_2$–$C_{20}$) alkynyl, and the ($C_1$–$C_{20}$) alkoxy, are substituted with one or more substituents comprising halogen, siliane, silyl, aryl, alkoxy, —Si(OH)$_3$, —CN, —SCN, —C=NS, —SH, —$NO_2$, —$SO_2H$, sulfonyl halide, acyl halide, aminyl, hydroxyaminyl, aminyl halide, $SO_3M$, —$PO_3M$, —P($R^4$)$_2$, carboxyl, keto, ester containing group, or —OH, with the proviso that when —OH is a substituent a carboxyl substituent is present on the compound, M is hydrogen or an alkali metal and $R^4$ is hydrogen or halogen.

3. The metal plating bath of claim 1, wherein the additive consumption inhibiting compound comprises 2,6-dihydroxybenzoic acid, 4-hydroxybenzoic acid resorcinol, 2,3-dihydroxybenzoic acid, 2,4-dihydroxybenzoic acid, 2,4,6-trihydroxybenzoic acid, 2,3,4-trihydroxybenzoic acid, methyl-3,4,5-trihydroxybenzoate, methyl-2,4-dihydroxybenzoate, 4-hydroxymandelic acid monohydrate, 3-(phenylthio) acetic acid, gallic acid, 4-vinylbenzoic acid, 3,4-dihydroxy-cinnamic acid, 4-methoxy cinnamic acid, 2-hydroxy cinnamic acid, trans-3-furanacrylic acid or mixtures thereof.

4. The metal plating bath of claim 1, wherein the additive consumption inhibiting organic compound comprises from about 0.001 g/L to about 100 g/L of the bath.

5. The metal plating bath of claim 1, further comprising additives comprising brighteners, levelers, hardeners, wetting agents, malleability modifiers, ductility modifiers, deposition modifiers, or suppressors.

6. The metal plating bath of claim 5, wherein the brighteners comprise compounds having the formulas: $HO_3$—S—$R^{11}$—SH; $HO_3S$—$R^{11}$—S—S—$R^{11}$—$SO_3H$, where $R^{11}$ is $C_1$–$C_6$ alkyl or an aryl group; or $HO_3$—Ar—S—S—Ar—$SO_3H$, where Ar is phenyl or naphthyl, the alky and aryl groups may be unsubstituted or substituted with an alkyl group, halogen or alkoxy group.

7. The metal plating bath of claim 5, wherein the brighteners comprise 3-mercapto-propylsulfonic acid sodium salt, 2-mercapto-ethanesulfonic acid sodium salt, bissulfopropyl disulfide, or mixtures thereof.

8. The plating bath of claim 5, wherein the levelers comprise alkylated polyalkyleneimines, organo sulfo sulfones, dyes of the phenazine class, phenazine azo dyes, or mixtures thereof.

9. The plating bath of claim 1, further comprising the additives 3-(benzthiazoyl-2-thio)-propylsulfonic acid sodium salt, 3-mercaptopropane-1-sulfonic acid sodium salt, ethylenedithiodipropylsulfonic acid sodium salt, bis-(p-sulfonphenyl)-disulfide disodium salt, bis-(ω-sulfobutyl)-disulfide disodium salt, bis-(ω-sulfohydroxypropyl)-disulfide disodium salt, bis-(ω-sulfopropyl)-disulfide disodium salt, bis-(ω-sulfopropyl)-sulfide disodium salt, methyl-(ω-sulfopropyl) sodium salt, methyl-(ω-sulfopropyl)-trisulfide disodium salt, O-ethyl-dithiocarbonic acid-S-(ω-sulfopropyl)-ester, potassium salt of thioglycolic acid, thiophosphoric acid-O-ethyl-bis-(ω-sulfopropyl)-ester disodium salt, thiophosphoric acid-tri(ω-sulfopropyl)-ester trisodium salt, N,N-dimethyldithiocarbamic acid (3-sulfopropyl) ester sodium salt, (O-ethyldithiocarbonato)-S-(3-sulfopropyl) ester potassium salt, 3-[(amino-iminomethyl)-thio]-1-propanesulfonic acid, 3-(2-benzthiazolylthio)-1-propanesulfonic acid sodium salt, or mixtures thereof.

10. The plating bath of claim 1, further comprising the additives carboxymethylcellulose, nonylphenolpolyglycol ether, octandiolbis-(polyalkylene glycolether), octanolpolyalkylene glycolether, oleic acidpolyglycol ester, polyethylenepropylene glycol, polyethylene glycol, polyethylene glycoldimethylether, polyoxypropylene glycol, polypropylene glycol, polyvinylalcohol, stearic acidpolyglycol ester, stearyl alcoholpolyglycol ether, or mixtures thereof.

11. The metal plating bath of claim 1, wherein the pH of the bath ranges from 0 to about 4.0.

12. A copper metal plating bath comprising a copper salt, and an additive consumption inhibiting compound having a formula:

wherein R, $R^1$, $R^2$ and $R^3$ independently comprise hydrogen; halogen; ($C_1$–$C_{20}$) linear, branched, or cyclic alkyl; ($C_2$–$C_{20}$) linear, branched, or cyclic alkenyl; ($C_2$–$C_{20}$) linear or branched alkynyl; sulfonyl halide; silane; silyl; —Si(OH)$_3$; —CN; —SCN; —C≡NS; —SH; —NO$_2$; SO$_2$H; —SO$_3$M; —PO$_3$M; aminyl; aminyl halide; hydroxyaminyl; ($C_1$–$C_{20}$) alkyl-O ($C_2$–$C_3$O)$_x$R$^6$, ($C_1$–$C_{12}$) alkylphenyl-O($C_2$–$C_3$O)$_x$R$^6$, -phenyl-O($C_2$–$C_3$O)$_x$R$^6$, where x is an integer of from 1–500 and $R^6$ is hydrogen, ($C_1$–$C_4$) alkyl or phenyl; —P($R^4$)$_2$ where $R^4$ is hydrogen or halogen; acyl halide; COR$^5$, where $R^5$ is —OH or ($C_1$–$C_{20}$) linear, branched, or cyclic alkyl, ($C_2$–$C_{20}$) linear, branched or cyclic alkenyl, ($C_2$–$C_{20}$) linear or branched alkynyl, ($C_1$–$C_{20}$) linear or branched alkoxy; or —OH with the proviso that a carboxyl is present as a substituent on the compound; the ($C_1$–$C_{20}$) alkyl, ($C_2$–$C_{20}$) alkenyl, ($C_2$–$C_{20}$) alkynyl and the ($C_1$–$C_{20}$) alkoxy may be unsubstituted or substituted; and M is hydrogen or an alkali metal; or $R^1$ and $R^2$ are taken together to form a chemical bond; or are taken together along with the atoms to which they are attached to form a 5 to 7 membered ring, or to form a 5 to 7 membered heterocyclic ring where oxygen or nitrogen are hetero-atoms in the ring, the 5 to 7 membered ring and the 5 to 7 membered heterocyclic ring may comprise one or more carbonyl groups; the 5 to 7 membered ring or the 5 to 7 membered heterocyclic ring may be fused with one or more five or six membered rings, the one or more five or six membered rings may contain one or more oxygen or nitrogen atoms, the fused rings may contain a carbonyl in the ring; the 5 to 7 membered ring, the one or more five or six membered fused rings, and the heterocyclic ring may be unsubstituted or substituted with one or more of halogen, silane, silyl, aryl, alkoxy, —Si(OH)$_3$, —CN, —SCN, —C≡NS, —SH, —NO$_2$, —SO$_2$H, sulfonyl halide, acyl halide, aminyl, hydroxyaminyl, aminyl halide, —PO$_3$M, —P($R^4$)$_2$, carboxyl, keto, ester containing group, or —OH, with the proviso that when —OH is a substituent a carboxyl substituent is present on the compound, M is hydrogen or an alkali metal, and $R^4$ is hydrogen or halogen.

13. The copper metal plating bath of claim 12, wherein the ($C_1$–$C_{20}$) alkyl, ($C_2$–$C_{20}$) alkenyl, and the ($C_2$–$C_{20}$) alkynyl, ($C_1$–$C_{20}$) alkoxy are substituted with one or more substituents comprising halogen, aryl, silane, silyl, —Si(OH)$_3$, —CN, —SCN, —C≡NS, —SH, —NO$_2$, —SO$_2$H, sulfonyl halide, acyl halide, aminyl, aminyl halide, hydroxyaminyl, —SO$_3$M, —PO$_3$M, —P($R^4$), keto, alkoxy, ester containing group, carboxyl, or —OH with the proviso that when a hydroxyl group is a substituent a carboxyl substituent is present on the compound, and M is hydrogen or an alkali metal and $R^4$ is hydrogen or halogen.

14. The copper metal plating bath of claim 12, wherein the additive consumption inhibiting compound comprises 2,6-dihydroxybenzoic acid, 4-hydroxybenzoic acid resorcinol, 2,3-dihydroxybenzoic acid, 2,4-dihydroxybenzoic acid, 2,4,6-trihydroxybenzoic acid, 2,3,4-trihydroxybenzoic acid, methyl-3,4,5-trihydroxybenzoate, methyl-2,4-dihydroxybenzoate, 4-hydroxymandelic acid monohydrate, 3-(phenylthio) acetic acid, gallic acid, 4-vinylbenzoic acid, 3,4-dihydroxy-cinnamic acid, 4-methoxy cinnamic acid, 2-hydroxy cinnamic acid, 3-furanacrylic acid or mixtures thereof.

15. The copper metal plating bath of claim 12, wherein the additive consumption inhibiting compound comprises from about 0.001 g/L to about 100 g/L of the bath.

16. The copper metal plating bath of claim 12, wherein the copper salt comprises copper halides, copper sulfates, copper alkane sulfonate, copper alkanol sulfonate, or mixtures thereof.

17. The copper metal plating bath of claim 12, wherein the bath has a pH of from 0 to about 4.0.

18. The copper metal plating bath of claim 12, further comprising additives comprising brighteners, levelers, hardeners, wetting agents, malleability modifiers, ductility modifiers, deposition modifiers, suppressants, or mixtures thereof.

19. The copper metal plating bath of claim 18, wherein the brighteners comprise compounds having the formulas: HO$_3$—S—$R^{11}$—SH; HO$_3$S—$R^{11}$—S—S—$R^{11}$—SO$_3$H, where $R^{11}$ is $C_1$–$C_6$ alkyl or aryl group; or HO$_3$—Ar—S—S—Ar—SO$_3$H, where Ar is phenyl or naphthyl, the alkyl and aryl groups may be unsubstituted or substituted with an alkyl group, halogen, or alkoxy.

20. The copper metal plating bath of claim 18, wherein the brighteners comprise 3-mercapto-propylsulfonic acid sodium salt, 2-mercapto-ethanesulfonic acid sodium salt, bissulfopropyl disulfide, or mixtures thereof.

21. The copper metal plating bath of claim 18, wherein the levelers comprise alkylated polyalkyleneimines, organo sulfo sulfones, dyes of the phenazine class, phenazine azo dyes, or mixtures thereof.

22. The copper metal plating bath of claim 18, wherein the brighteners comprise 3-(benzthiazoyl-2-thio)-propylsulfonic acid sodium salt, 3-mercaptopropane-1-sulfonic acid sodium salt, ethylenedithiodipropylsulfonic acid sodium salt, bis-(p-sulfophenyl)-disulfide disodium salt, bis-(ω-sulfobutyl)-disulfide disodium salt, bis-(ω-sulfohydroxypropyl)-disulfide disodium salt, bis-(ω-sulfopropyl)-didulfide disodium salt, bis-(ω-sulfopropyl)-sulfide disodium salt, methyl-(ω-sulfopropyl) sodium salt, methyl-(ω-sulfopropyl)-trisulfide disodium salt, O-ethyl-dithiocarbonic acid-S-(ω-sulfopropyl)-ester, potassium salt of thioglycolic acid, thiophosphoric acid-O-ethyl-bis-(ω-sulfopropyl)-ester disodium salt, thiophosphoric acid-tri(ω-sulfopropyl)-ester trisodium salt, N,N-dimethyldithiocarbamic acid (3-sulfopropyl) ester sodium salt, (O-ethyldithiocarabonato)-S-(3sulfopropyl) ester potassium salt, 3-[(amino-iminomethyl)-thio]-1-propanesulfonic acid, 3-(2-benzthiazolylthio)-1-propanesulfonic acid sodium salt, or mixtures thereof.

23. The copper plating bath of claim 18, wherein the levelers comprise carboxymethylcellulose, nonylphenolpolyglycol ether, octandiolbis-(polyalkylene glycolether), octanolpolyalkylene glycolether, oleic acid-polyglycol ester, polyethylenepropylene glycol, polyethylene glycol, polyethylene glycoldimethylether, polyoxypropylene glycol, polypropylene glycol, polyvinylalcohol, stearic acidpolyglycol ester, stearyl alcoholpolyglycol ether, or mixtures thereof.

* * * * *